United States Patent
Niki et al.

(10) Patent No.: US 7,605,012 B2
(45) Date of Patent: Oct. 20, 2009

(54) ZNO BASED COMPOUND SEMICONDUCTOR LIGHT EMITTING DEVICE AND METHOD FOR MANUFACTURING THE SAME

(75) Inventors: Shigeru Niki, Tsukuba (JP); Paul Fons, Tsukuba (JP); Kakuya Iwata, Tsukuba (JP); Tetsuhiro Tanabe, Kyoto (JP); Hidemi Takasu, Kyoto (JP); Ken Nakahara, Kyoto (JP)

(73) Assignees: National Institute of Advanced Industrial Science & Tech., Tokyo (JP); Rohm Co., Ltd., Kyoto-shi (JP)

( * ) Notice: Subject to any disclaimer, the term of this patent is extended or adjusted under 35 U.S.C. 154(b) by 286 days.

(21) Appl. No.: 11/166,254

(22) Filed: Jun. 27, 2005

(65) Prior Publication Data

US 2005/0247954 A1    Nov. 10, 2005

Related U.S. Application Data

(60) Division of application No. 10/713,205, filed on Nov. 17, 2003, now Pat. No. 6,987,029, which is a continuation of application No. 10/031,931, filed on Jan. 25, 2002, now Pat. No. 6,674,098.

(51) Int. Cl.
H01L 21/00    (2006.01)

(52) U.S. Cl. .................... 438/46; 438/479; 438/481; 257/E21.09; 257/E21.461

(58) Field of Classification Search .............. 438/46, 438/479, 481; 257/E21.09, E21.461
See application file for complete search history.

(56) References Cited

U.S. PATENT DOCUMENTS

| | | | |
|---|---|---|---|
| 3,664,867 A * | 5/1972 | Galli et al. ............... 428/336 |
| 3,944,732 A | 3/1976 | Kino |
| 4,737,684 A * | 4/1988 | Seto et al. ............... 313/503 |
| 5,009,720 A | 4/1991 | Hokuyo et al. |
| 5,151,006 A | 9/1992 | Marttila et al. |
| 5,521,454 A * | 5/1996 | Hattori et al. .......... 310/313 R |
| 5,532,537 A * | 7/1996 | Koike et al. ............ 310/313 A |
| 5,569,548 A * | 10/1996 | Koike et al. ............ 428/699 |
| 5,605,867 A | 2/1997 | Sato et al. |
| 5,741,580 A * | 4/1998 | Hayamizu et al. ........ 428/221 |
| 5,815,520 A * | 9/1998 | Furushima ............... 372/45.01 |
| 5,889,295 A | 3/1999 | Rennie et al. |
| 6,045,626 A * | 4/2000 | Yano et al. ................ 148/33.4 |
| 6,057,561 A | 5/2000 | Kawasaki et al. |
| 6,071,633 A * | 6/2000 | Potter ........................ 428/690 |
| 6,078,717 A * | 6/2000 | Nashimoto et al. ......... 385/130 |
| 6,086,673 A * | 7/2000 | Molnar ....................... 117/90 |
| 6,127,768 A * | 10/2000 | Stoner et al. ............. 310/313 A |
| 6,153,010 A | 11/2000 | Kiyoku et al. |
| 6,410,162 B1 | 6/2002 | White et al. |
| 6,456,640 B1 | 9/2002 | Okumura |
| 2002/0126719 A1 * | 9/2002 | Kadota ...................... 372/45 |

FOREIGN PATENT DOCUMENTS

| | | |
|---|---|---|
| EP | 0 863 555 A2 | 9/1998 |
| JP | 55-110089 | 8/1980 |
| JP | 7-283436 | 10/1995 |
| JP | 09-326534 A | 12/1997 |
| JP | 10-256673 | 9/1998 |
| JP | 10-270749 | 10/1998 |
| JP | 2000-82842 | 3/2000 |
| JP | 2000-101138 | 4/2000 |
| JP | 2000-244015 | 9/2000 |

OTHER PUBLICATIONS

Appl. Phys. Lett., vol. 72, No. 25, p. 3270-3272 (Jun. 22, 1998).
Appl. Phys. Lett., vol. 74, No. 17, p. 2534-2536 (Apr. 26, 1999).

* cited by examiner

Primary Examiner—Michelle Estrada
(74) Attorney, Agent, or Firm—Arent Fox LLP

(57) ABSTRACT

A light emitting device includes a silicon substrate (1), a silicon nitride film (2) formed on the surface of the silicon substrate (1), at least an n-type layer (3), (4) and a p-type layer (6), (7) which are formed on the silicon nitride film (2) and also which are made of a ZnO based compound semiconductor, and a semiconductor layer lamination (11) in which layers are laminated to form a light emitting layer. Preferably this silicon nitride film (2) is formed by thermal treatment conducted in an atmosphere containing nitrogen such as an ammonium gas. Also, in another embodiment, a light emitting device is formed by growing a ZnO based compound semiconductor layer on a main face of a sapphire substrate, the main face being perpendicular to the C-face thereof. As a result, it is possible to obtain a device using a ZnO based compound with high properties such as an LED very excellent in crystallinity and having a high light emitting efficiency.

5 Claims, 9 Drawing Sheets

F I G. 8 (a)
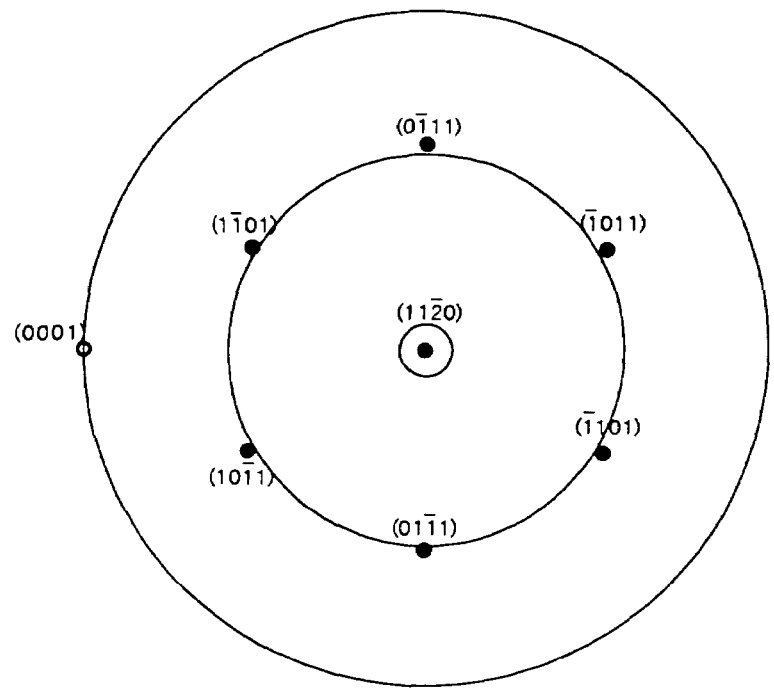
F I G. 8 (b)
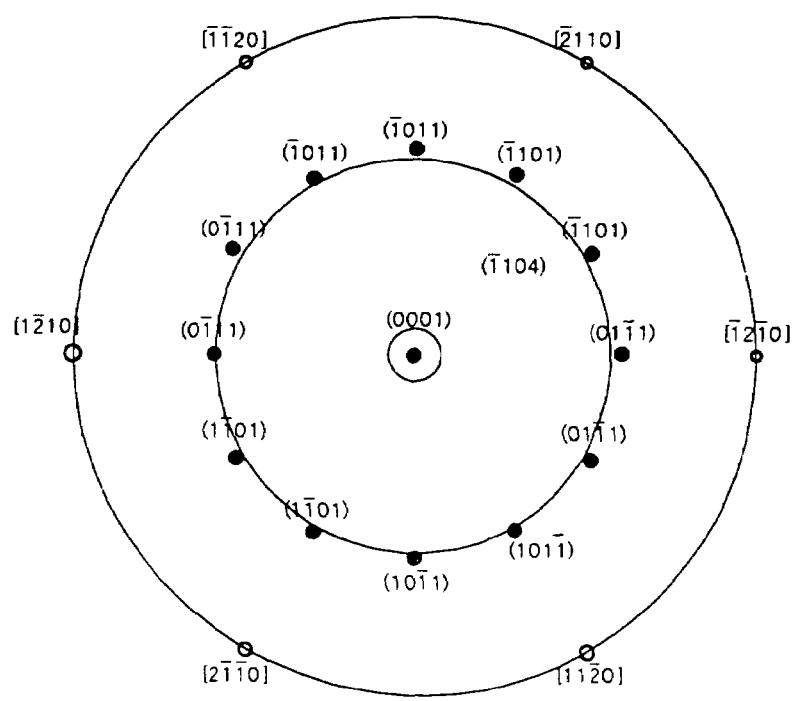

F I G. 1 2
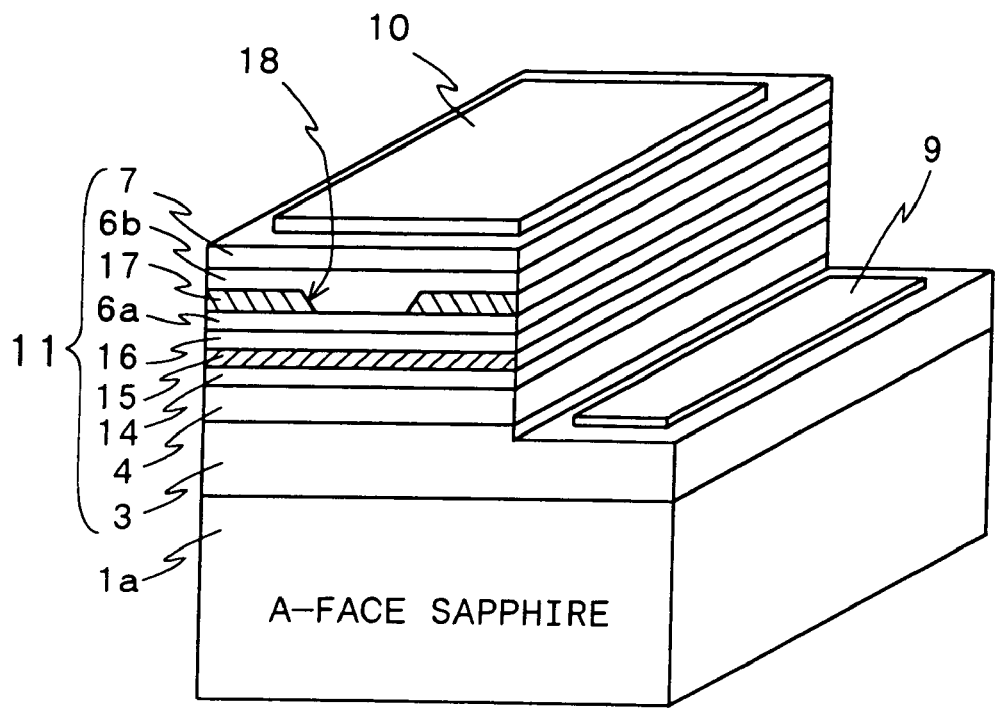
F I G. 1 3
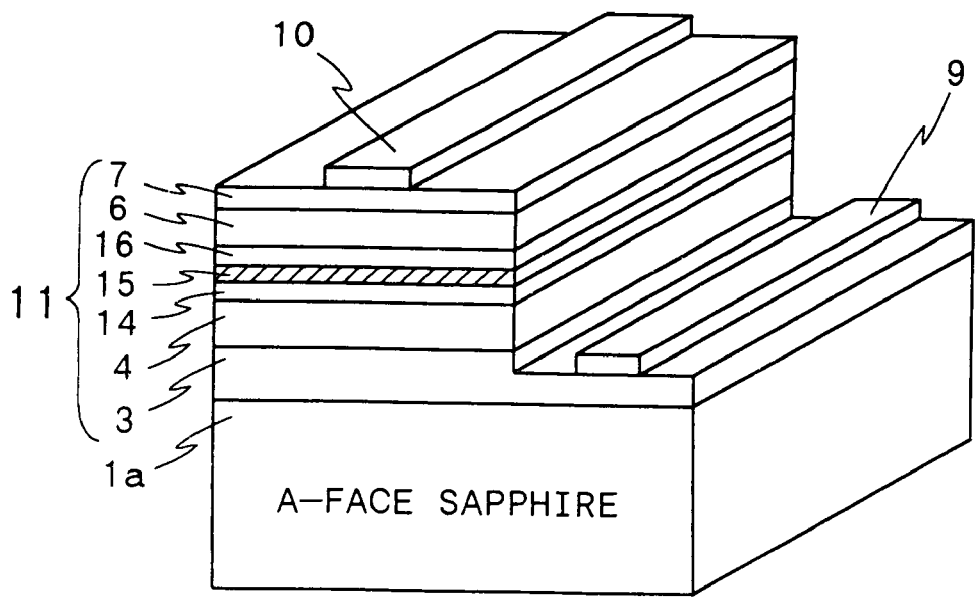

ZNO BASED COMPOUND SEMICONDUCTOR LIGHT EMITTING DEVICE AND METHOD FOR MANUFACTURING THE SAME

This is a Division of application Ser. No. 10/713,205 filed Nov. 17, 2003, now U.S. Pat. No. 6,987,029, which in turn is a Continuation Application of Parent application Ser. No. 10/031,931 filed Jan. 25, 2002 now U.S. Pat. No. 6,674,098. The disclosure of the prior application(s) is hereby incorporated by reference herein in its entirety.

FIELD OF THE INVENTION

The present invention relates to a semiconductor light emitting device such a semiconductor laser or a light emitting diode that is capable of emitting a light in a blue region required for higher definition of an optical disc memory having a high recording density, a laser beam printer, etc. which use a ZnO based compound semiconductor, and a method for manufacturing the same, and a device using a ZnO based compound semiconductor such an SAW device, a pyroelectric device, a piezo-electric device, a gas sensor, etc. and a method for growing a crystal of a ZnO based compound semiconductor layer used in the manufacture of the same. More particularly, the present invention relates to a device using a ZnO based compound semiconductor that is capable of providing electrodes on both right and back sides of a chip and also capable of cleavage or that is capable of growing a ZnO based compound semiconductor layer with good crystallinity to improve element characteristic such as light emitting efficiency, and a method for growing a ZnO based compound semiconductor layer for the manufacture of such devices.

BACKGROUND ART

Recently, blue region (which means to be of a wavelength range of ultra-violet to yellow colors) light emitting diodes (hereinafter abbreviated as LEDs) for use as a light source used in a full-color display and signal lamp or blue region semiconductor lasers (hereinafter abbreviated as LDs) for a light source used in a next-generation high-definition DVD capable of continuous oscillation at room temperature, were developed by growing GaN-based compound semiconductor layers on the C-plane of a sapphire substrate, and thereby drawing attention from the industries.

As shown in FIG. 14 illustrating a perspective explanation view of an LD chip, this structure comprises a sapphire substrate 21 and group III nitride compound semiconductor layers sequentially grown thereon by Metal Organic Chemical Vapor Deposition (hereinafter abbreviated as MOCVD), in such a configuration that a GaN buffer layer 22, an n-type GaN layer 23, an n-type clad layer 24 made of $Al_{0.12}Ga_{0.88}N$, an n-type light guide layer 25 made of GaN, an active layer 26 having a multi-quantum well structure made of InGaN-based compound, a p-type light guide layer 27 made of p-type GaN, a first p-type clad layer 28a made of p-type $Al_{0.2}Ga_{0.8}N$, a second p-type clad layer 28b made of $Al_{0.12}Ga_{0.88}N$, and a contact layer 29 made of p-type GaN are stacked sequentially and parts of these stacked semiconductor layers are dry-etched, as shown in FIG. 14, to expose the n-type GaN layer 23 on which an n-side electrode 31 is formed with a p-side electrode 30 being formed on the contact layer 29.

The ZnO based compound semiconductor, on the other hand, has been studied in a variety of aspects because it has wide-gap energy semiconductor so that Cd can be mixed in crystallinity to narrow the band gap energy and also emit a blue region light similarly and also because it can be used in a SAW device, a pyro-electric device, a piezoelectric device, etc. This ZnO based compound semiconductor is also a hexagonal crystal like GaN based compound and sapphire, and so has an approximate value of the lattice constant, so that (0001) sapphire having a C-plane as its main plane which is used generally as a substrate for growing epitaxially GaN based compound semiconductor layers in the industries is expected to be used as a substrate for growing ZnO based compound semiconductor layers.

The growth of a ZnO based compound semiconductor on the (0001) sapphire substrate is described in, for example, "Room-temperature ultraviolet laser emission from self-assembled ZnO microcrystallite thin films", Applied Physics Letters, Vo. 72, No. 25, issued on Jun. 22, 1998, pp. 3270-3272.

As mentioned above, since a substrate employed in the prior art blue region semiconductor light emitting device is made of (0001) sapphire having the C-plane as its main plane, it has no conductivity and cannot give therein a vertical-type device (which means to have a construction in which electrodes are provided on both right and back sides of the chip) that has electrodes on both its top and bottom faces of a stack. These electrodes, therefore, must be provided on the upper surface of the semiconductor layer lamination and the surface of its underlying semiconductor layer exposed by etching part of the upper layers, thus giving birth to a problem of complicating manufacturing processes such as etching process and chip die bonding process. Moreover, since the sapphire substrate is very hard, it cannot be cloven easily and is difficult to form a flat end face necessary as the mirror surface of an optical resonator for a semiconductor laser, problematically. That is, although the sapphire substrate is capable of obtaining a well-conditioned mono-crystal semiconductor layer, it has an inevitable difficulty in processibility and formation of electrodes during the manufacturing process.

Further, sapphire has a c-axial length $C_S$ of 1.2991 nm and an a-axial length as of 0.4754 nm, while ZnO has a c-axial length $c_z$ of 0.5213 nm and an a-axial length $a_z$ of 0.325 nm, so that the lattice mismatching rate $\epsilon$ becomes a very large value of $\epsilon=(a_z-a_s)/a_s=-31.6\%$. In this case, as shown in FIG. 15, the ZnO crystal may sometimes grow as rotated by 30 degrees, even in which case, the crystal mismatching degree $\epsilon$ has a very large value of $\epsilon=(2/3^{1/2} \cdot a_z-z_s)/a_s=-21.1\%$. This brings about complicated actions of such various parameters as a substrate temperature at the time of crystal growth, amounts of Zn and O elements supplied, a substrate surface treatment method, and an inclination angle, thus giving birth to a problem of poor reproducibility of the flatness of a crystal-growing surface.

Also, since sapphire and ZnO mismatch in lattice constant with each other, the ZnO crystal may sometimes grow as rotated by 30 degrees as mentioned above, so that there are mixed a crystal not rotated and a crystal rotated by 30 degrees, thus giving birth to a problem of even poorer reproducibility of the flatness of the crystal growing surface.

In view of the above, it is a first object of the present invention to provide a semiconductor light emitting device such as an LED or LD made of a ZnO based compound semiconductor, that is of a vertical type capable of providing electrodes from both right and back sides of a chip thereof, that has excellent crystallinity of a semiconductor layer thereof and a good light emitting efficiency, and that does not use sapphire as a material of a substrate thereof to thereby provide a convenient construction in both manufacture and use.

It is a second object of the present invention to provide a semiconductor light emitting device manufacturing method involving surface treatment of a silicon substrate fitted especially to a purpose of growing a ZnO based compound semiconductor on the silicon substrate with good crystallinity.

It is a third object of the present invention to provide a device using a ZnO based compound such as a semiconductor light emitting device with improved device properties which gives a ZnO based compound crystal layer with good crystallinity even on a sapphire substrate.

It is a fourth object of the present invention to provide such a method for growing a ZnO based compound layer that is capable of giving a ZnO based compound crystal layer with excellent crystallinity even on a sapphire substrate.

It is a fifth object of the present invention to provide a semiconductor light emitting device such as an LED or LD having excellent light emitting properties which employs a ZnO based compound semiconductor while using a sapphire substrate.

DISCLOSURE OF THE INVENTION

The present inventors greatly investigated about how to grow a ZnO based compound semiconductor on a large-diameter and easy-to-handle silicon substrate by eliminating inconveniency of growing the ZnO based compound semiconductor on a sapphire substrate as mentioned above, to achieve the first and second objects. As a result, it was found that a reason why an attempt to grow a ZnO based compound semiconductor directly on a silicon substrate results in an amorphous ZnO based compound to thereby disable obtaining a semiconductor layer with good crystallinity is that radical oxygen introduced to grow the ZnO based compound acts to fiercely oxidize the surface of the silicon substrate first to there make the surface amorphous before ZnO based compound grows, so that by forming beforehand a thin nitride film by nitridating the surface of the silicon substrate, the surface of the silicon substrate can be prevented from being oxidized to thereby grow a ZnO based compound semiconductor layer excellent in crystallinity, thus obtaining a semiconductor light emitting device having excellent light emitting properties.

To achieve the first object, a semiconductor light emitting device according to the present invention includes a silicon substrate, a silicon nitride film formed on the surface of the silicon substrate, and a semiconductor layer lamination which is formed on the silicon nitride film and also which has at least n-type and p-type layers made of an ZnO based compound semiconductor to thereby form a light emitting layer.

A ZnO based compound semiconductor referred to here specifically means ZnO or an oxide of Zn and one or more group IIA elements, Zn and one or more group IIB elements, or Zn and one or more group IIA and group IIB elements. This is the same in the following description.

By providing such a construction, in which a silicon nitride film is formed on the surface of a silicon substrate, even when radical oxygen is introduced to grow a ZnO based compound semiconductor layer, the surface of the silicon substrate is not roughened by oxidation, thus enabling growing on the surface a ZnO based compound semiconductor layer with good crystallinity. As a result, it is possible to obtain a semiconductor layer lamination with good crystallinity and hence a semiconductor light emitting device excellent in light emitting properties.

Preferably the surface of the silicon nitride film is not formed amorphous but flat to thereby further improve the crystallinity of a ZnO based compound semiconductor later formed thereon.

In this specification, to be flat in surface of the silicon nitride film refers to such a surface condition that the surface is not amorphous nor irregular so its lattice array may be recognizable, for example, such a condition that a streaky or spotty image may appear as a result of, for example, reflective high-energy electron diffraction (RHEED, by which an electron beam accelerated at 10-50 kV is made incident upon a substrate surface with a small angle (1-2 degrees) to thereby project the electron beam reflected and diffracted by surface atoms onto a screen in order to check the crystal surface condition).

The silicon nitride film should preferably be formed to a thickness of not more than 10 nm so that its surface may not be poly-crystallized but be flat.

Preferably the semiconductor layer lamination has a double-hetero construction that sandwiches an active layer made of $Cd_xZn_{1-x}O$ ($0 \leq x<1$) between clad layers which are made of $Mg_yZn_{1-y}O$ ($0 \leq y<1$) and also each of which has a larger band gap energy than that of the active layer, to thereby provide an LED or LD made of a ZnO based compound semiconductor and excellent in light emitting properties.

To achieve the second object, a method for manufacturing a semiconductor light emitting device of the present invention includes the steps of; forming a silicon nitride film on a surface of a silicon substrate by conducting heat treatment the silicon substrate in an atmosphere containing nitrogen, and growing on the silicon nitride film a semiconductor layer lamination to form a light emitting layer which is made of a ZnO based compound semiconductor.

This method makes it possible to form a nitride film on the surface of a silicon substrate so that the surface may not be oxidized and, at the same time, not be poly-crystallized to thereby maintain a crystallized surface of the silicon substrate on which a ZnO based compound semiconductor excellent in crystallinity can be grown and also to form the silicon nitride film very thin to thereby prevent electrical discontinuity between the silicon substrate and the semiconductor layer lamination.

To prevent the poly-crystallization, preferably the step of forming the silicon nitride film is performed while controlling the processing temperature or time in such a manner that the surface of the silicon nitride film formed may maintain the flatness of the silicon substrate surface. That is, preferably the nitridation processing is conducted at 650° C. for 5 to 10 minutes or so and, more preferably, for 7 minutes or so to obtain a ZnO based compound semiconductor layer excellent in crystallinity; if it is conducted for 15 minutes or so, however, the surface is poly-crystallized to poly-crystallize a ZnO based compound semiconductor grown thereon also, so that it is impossible to obtain a ZnO based compound semiconductor layer with good crystallinity. At a temperature of 800° C., on the other hand, nitridation processing needs to be conducted only for 3 minutes or so to obtain a ZnO based compound semiconductor layer excellent in crystallinity; while at the lower temperature, conversely, the processing time should preferably be longer. Those conditions can be set so as to provide a flat surface of the silicon nitride film by checking the surface condition using, for example, the above-mentioned RHEED method.

To achieve the third through fifth objects, the present inventors greatly investigated to grow a ZnO based compound layer with fewer lattice defects and better crystallinity in order to grow a ZnO based compound crystal layer on a sapphire substrate. As a result, it was found that a ZnO based compound layer can be grown on the surface of a sapphire substrate by growing on a main face such an A-face that is perpendicular to the C-face, to thereby obtain a device very excellent in crystallinity as well as in device properties such as light emitting properties.

To achieve the third object, a device having a ZnO based compound layer of the present invention comprises a sapphire substrate which has its main face that is perpendicular to the C-face thereof and a ZnO based compound layer grown epitaxially on the main face of the sapphire substrate.

The term "face perpendicular to the C-face of a sapphire substrate" here includes, besides the sapphire's A-face, a face that crosses at right angles with the C-face, which may rotate in the C-face plane and the term "perpendicular" implies an allowance of ±0.5 degree, a typical value in the substrate specifications.

In such a construction, a ZnO based compound layer grows perpendicularly to the c-axis of the sapphire substrate, so that the a-axis of ZnO grows along the c-axis of sapphire. As a result, presumably, four crystals of the ZnO based compound each measuring an a-axial length (of 0.325 nm) go along a c-axial length (of 1.2991 nm) to thereby give a very low crystal mismatching degree of 0.07% or so, thus providing an excellent crystal face.

Preferably the sapphire substrate has an A-face as its main face because it is easy to get.

To achieve the fourth object, a method for growing a ZnO based compound layer of the present invention features that the ZnO based compound layer is epitaxially grown on a sapphire substrate so that the c-axis of the ZnO based compound layer may be perpendicular to the c-axis of the sapphire substrate.

To achieve the fifth object, a semiconductor light emitting device of the present invention includes a sapphire substrate having its main face that is perpendicular to the C-face thereof, and a semiconductor layer lamination which layers are laminated to form a light emitting layer, the layers having at least n-type and p-type layers made of a ZnO based compound semiconductor grown epitaxially on the main face of the sapphire substrate. The main face of the sapphire substrate perpendicular to the C-face may be, for example, the A-face.

Preferably the semiconductor layer lamination has a double-hetero construction that sandwiches an active layer made of $Cd_xZn_{1-x}O$ ($0 \leq x<1$) by clad layers which are made of $Mg_yZn_{1-y}O$ ($0 \leq y<1$) and also each of which has a larger band gap energy than that of the active layer to thereby obtain an LED or LD made of an ZnO based compound semiconductor and excellent in light emitting properties.

BRIEF DESCRIPTION OF THE DRAWINGS

FIG. 8(a) is an illustration for showing a pole figure by an X-ray reflected image of a ZnO layer grown on a sapphire substrate having an A-face as its main face of the present invention and FIG. 8(b) is a similar illustration of that grown on a sapphire substrate having a C-face as its main face;

FIG. 12 is an illustration for showing the LD chip according to another example of the semiconductor light emitting device of the present invention using an A-face sapphire substrate;

FIG. 13 is an illustration for showing the LD chip according to a further example of the semiconductor light emitting device of the present invention having an A-face sapphire substrate;

BEST MODE FOR CARRYING OUT THE INVENTION

The following will describe a semiconductor light emitting device using a silicon substrate of the present invention and a method for manufacturing the same with reference to the drawings.

Figure 1:
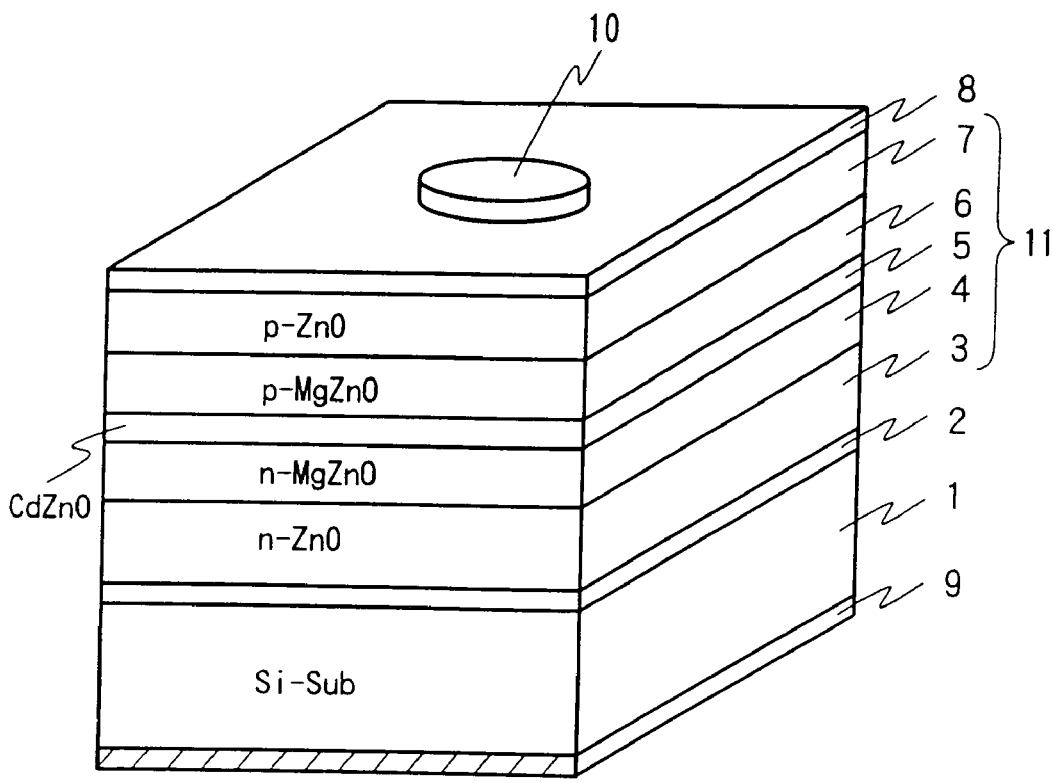
FIG. 1 is a perspective explanation view for showing an LED chip of a semiconductor light emitting device according to one embodiment of the present invention.

As shown in FIG. 1 illustrating a perspective explanation view of an LED chip according to its one embodiment, a semiconductor light emitting device of the present invention using a silicon substrate comprises a silicon substrate 1, a silicon nitride film 2 formed thereon, and a semiconductor layer lamination 11 formed thereon, which lamination 11 has at least n-type layers 3 and 4 and p-type layers 6 and 7 made of a ZnO based compound semiconductor to form a light emitting layer.

As mentioned above, the present inventors greatly investigated to grow a ZnO based compound semiconductor with good crystallinity on a silicon substrate and it was found that an attempt to grow a ZnO based compound semiconductor directly on the silicon substrate results in radical oxygen composing this ZnO based compound semiconductor first reacting fiercely with silicon to make the surface amorphous and form irregularities therein, thus making it impossible to obtain a ZnO based compound semiconductor layer with good crystallinity. Then, it was found that first by nitridating the surface of the silicon substrate to combine the dangling-bonded Si and N (nitrogen) on the substrate surface to thereby form a silicon nitride film thin, a ZnO based compound semiconductor with good crystallinity can be grown on this film.

This silicon nitride film could be preferably formed on the surface of the silicon substrate through nitridation processing involving heat treatment thereof in an atmosphere containing nitrogen such as a nitrogen gas or ammonium gas, but excessive nitridation processing resulted in the ZnO based compound semiconductor on the substrate surface being poly-crystallized, thus making it impossible to obtain a ZnO based compound semiconductor with good crystallinity.

That is, we put a washed silicon substrate 1 in an MBE (Molecular Beam Epitaxy) growing apparatus, for example, introduced $NH_3$ gas plasma-excited by an RF power source, and formed the silicon nitride film 2 by heat treatment in various conditions of the processing temperature and time. Further we grew a ZnO based compound semiconductor layer on each silicon nitride film formed by various conditions and checked the film quality of a ZnO based compound semiconductor layer grown thereon. This check came up with such a result shown in Table 1 below that a very good film quality of the ZnO based compound semiconductor layer is obtained by heat treatment at 650° C. for 7 minutes (as indicated by ⊚), a good film quality thereof is obtained by heat treatment for 5-10 minutes (as indicated by ○), and a non-preferable film quality thereof is obtained by heat treatment at the same temperature for 15 minutes because the ZnO based compound semiconductor becomes amorphous (as indicated by X). Also, nitridation processing at 800° C. for 3 minutes resulted in the same good film quality being obtained of the ZnO based compound semiconductor layer.

TABLE 1

Film quality vs. nitridation processing temperature and time

| Processing temperature(° C.) | 650 | 650 | 650 | 650 | 800 |
|---|---|---|---|---|---|
| Processing time(minute) | 5 | 7 | 10 | 15 | 3 |
| Film quality | ○ | ⊚ | ○ | X | ○ |

Figure 2:
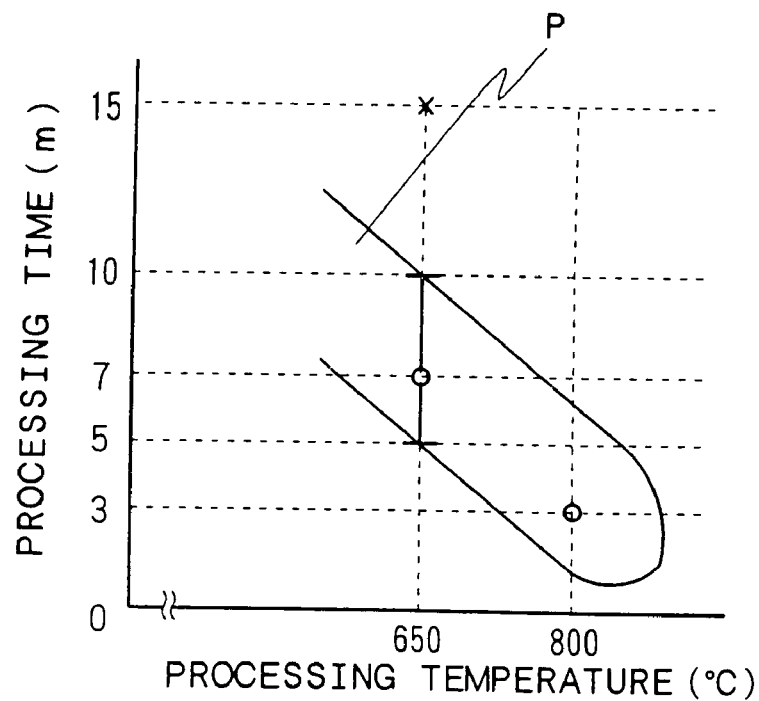
FIG. 2 is a graph for showing a preferred relationship between a temperature and a time of nitridation processing of a silicon substrate surface.

This relationship may be reflected on the graph shown in FIG. 2, in which naturally, at a lower temperature the processing rate is lowered so that a longer processing time is required to obtain the same film quality, so that presumably by conducting the processing under the conditions in a range P surrounded by a solid line in FIG. 2, a good quality of the silicon nitride film can be obtained and hence a good quality of the ZnO based compound semiconductor layer grown thereon can be obtained.

Figure 3:
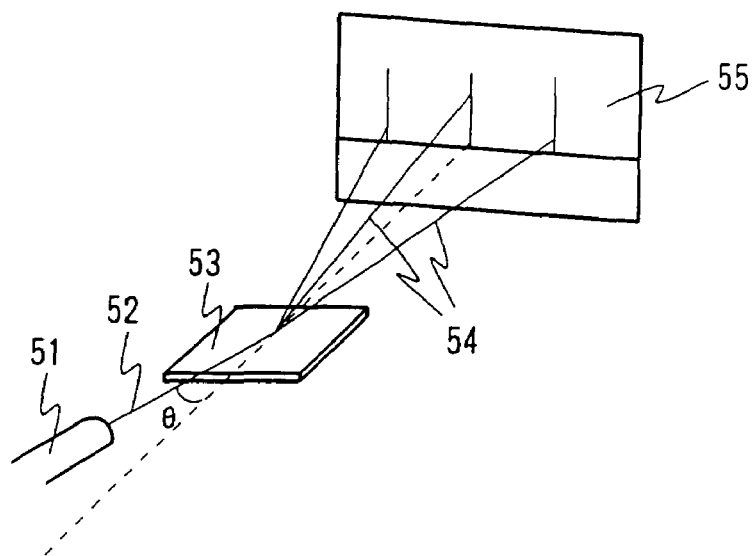
FIGS. 3(a) to 3(c) are illustrations for showing the RHEED method for checking a substrate surface and diffracted images of the substrate surface observed.
Figure 3:
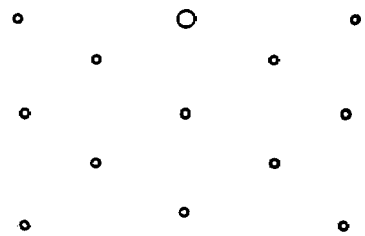
Figure 3:
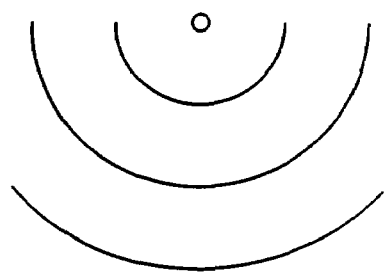

The film quality is specifically checked using so-called a reflection high-energy electron diffraction method (RHEED method) typically provided to an MBE apparatus: that is, as shown in FIG. 3A, an electron beam 52 accelerated by an electron gun 51 at an energy level of 10-50 kV is made incident upon the surface of a substrate 53 at a shallow angle θ (1 to 2 degrees or less) to be reflected and diffracted by surface atom to provide an electron beams 54, which is in turn applied onto a fluorescent screen 55 to check the crystal surface condition, in which the electron beam 51 was accelerated at 20 kV. By this method, a shallow angle is employed to make the electron beam incident, reflect it, and measure the diffracted beam, so that it is possible to conduct measurement while forming a film without affecting a supply of the electron beam in a direction perpendicular to the substrate 53.

A relevant diffracted image appears in the light and shade of a straight line or a band form (streaking image) if the substrate surface has a crystal construction, and when the substrate surface has irregularities thereon and so has islands formed thereon, electron beams which are transmitted and diffracted through these islands have a large influence to thereby permit a spotty image to appear in place of the streaking image. If the surface has a poly-crystal construction, on the other hand, the spot disappears to give a ring-shaped diffracted image instead. This is ascribed to a random distribution of the orientations of crystallite. Further, if the surface becomes amorphous, the atom array loses periodicity, so that the diffraction conditions cannot be met, thus render the RHEED line a halo with a uniform intensity. Thus, by this measurement method, it is possible to observe the surface condition of the silicon nitride film 2 and to similarly check the film quality of the ZnO based compound semiconductor layer grown thereon, thus it is possible to know about a correlation between the film quality of the ZnO based compound semiconductor layer and the heat treatment.

When the surface of the silicon substrate 1 is nitridated while measuring the surface condition, first an oxide film is remained on the silicon substrate surface, so that the surface is not flat, thus giving a ring-shaped diffracted image as shown in FIG. 3(c). When, in this state, an $NH_3$ gas is plasma-excited by an RF power source is introduced into the chamber of an MBE apparatus, as described above, to then heat up the holder (substrate) to 650° C. or so, the oxygen of the oxidized surface of the silicon substrate 1 is reduced and removed, to permit a spotty image to appear as shown in FIG. 3(b). When this state is kept as is, the oxygen of the surface is removed to permit dangling-bonded Si and N to be combined with each other so as to form a silicon nitride, which is to be followed by nitridation processing; in this case, however, if the nitride film 2 has a thickness of not more than 10 nm or so, the diffracted image remains as spotty. If nitridation processing is conducted for longer than 10 minutes, the spotty image is blurred and, if it is conducted for 15 minutes or so, a ring-shaped image appears as shown in FIG. 3(c) again.

That is, the above-mentioned good film quality can be obtained only when a ZnO based compound semiconductor is grown on a flat nitride film in such a state that a spotty diffracted image such as shown in FIG. 3(b) may be obtained or that a spotty image may be blurred a little, while in such a state that a ring-shaped diffracted image appears as shown in FIG. 3(c), in which nitridation processing has been conducted excessively to make irregularities on the surface prominent, thus the crystallinity of a ZnO based compound semiconductor layer grown thereon is deteriorated. To suppress irregularities due to an amorphous surface, therefore, nitridation processing can be conducted to keep flatness of the surface, thus obtaining a good film quality of the ZnO based compound semiconductor layer.

As the silicon substrate 1, for example, a phosphorus (P) doped n-type silicon substrate (111) can be used that is employed in typical ICs. Besides, for example, a boron (B) doped p-type substrate or a one having a face orientation of (100) may be used. This silicon substrate 1 firstly undergoes organic washing such as ultra-sonic washing by use of acetone, methanol, and pure water and then substrate washing involving light etching of a surface oxide film by use of diluted hydrofluoric acid solution.

As mentioned above, preferably the silicon nitride film 2 is formed through heat treatment in an atmosphere containing nitrogen because the surface of the silicon substrate 1 will neither become poly-crystallized nor be amorphous. Although this nitridation processing does not always require an MBE apparatus as mentioned above, preferably it is used because the processing can be conducted while observing the process using the RHEED method. Also, although, as mentioned above, an ammonium gas has been plasma-excited and used to provide an atmosphere containing nitrogen, an $N_2$ gas may be plasma-excited or an $NO_2$ gas may be used. As mentioned above, this silicon nitride film 2 is processed so that it may not be poly-crystallized but be flat. That is, it is preferably formed to a thickness of 10 nm or less and, more preferably, to a thickness of 5 nm or less. The required conditions may be adjusted in terms of the processing temperature and time; a higher temperature corresponds to a shorter processing time and a lower temperature corresponds to a comparatively longer processing time.

In an example shown in FIG. 1, a semiconductor layer lamination 11 includes a contact layer 3 made of Ga-doped n-type ZnO and formed to a thickness of 1 μm or so, an n-type clad layer 4 made of a similarly Ga-doped $Mg_yZn_{1-y}O$ ($0 \leq y < 1$, for example, y=0.15) and formed to a thickness of 0.2 μm, an active layer 5 formed to a thickness of 0.1 μm and made of $Cd_xZn_{1-x}O$ ($0 \leq x < 1$, for example, x=0.08 to provide such a composition as to provide a smaller band gap energy than that of the clad layer), a p-type clad layer 6 formed with a thickness of 0.2 μm and made of $Mg_yZn_{1-y}O$ ($0 \leq y < 1$, for example y=0.15) to which Ga and N are doped simultaneously, and a p-type contact layer 7 formed to a thickness of 1 μm and made of ZnO to which Ga and N are doped simultaneously, in this order. And this semiconductor layer lamination 11 has a light emitting layer formation made of double hetero construction of the active layer 5 and clad layers 4, 6. These semiconductor layers are consecutively grown using the above-mentioned MBE apparatus following the nitridation processing. Note here that preferably the active layer 5 is non-doped in order to avoid formation of a non-light emitting recombination center. Also, the n-type clad layer 4 and the p-type clad layer 6 are formed to have a band gap larger than that of the active layer 5 in order to effectively confine the carrier in the active layer 5.

To diffuse a current, a transparent electrode 8 made of, for example, an ITO film is formed to a thickness of 0.2 μm on the semiconductor layer lamination 11, on part of the surface of which electrode 8 is formed a p-side electrode 10 made of a Ni/Al or Ni/Au layers using a lift-off method etc. and on the back side surface of the silicon substrate 1 is thoroughly formed an n-side electrode 9 made of a Ti/Al or Ti/Au layers.

The following will describe how to manufacture this LED. First the silicon substrate 1 is set, for example, in an MBE apparatus and heated to 650° C. or so; then a $NH_3$ gas is plasma-excited by a high-frequency power source of a power of 300 W or so and then introduced into the chamber at a flow rate of 0.6 sccm. The flow rate takes on such a value preferably, to enhance the intensity of a plasma-excited light. Then, nitridation processing is conducted for seven minutes or so.

Next, the substrate 1 is cooled down to 300 to 450° C. to then open the shutter of a Zn supply source (cell) under the application of plasma oxygen in order to irradiate Zn with it and, also, to open the n-type dopant Ga shutter in order to grow the n-type contact layer 3 to a thickness of 1 μm or so which is made of n-type ZnO. Next, another Mg supply source (cell) shutter is opened to grow the n-type clad layer to a thickness of 0.2 μm or so which is made of $Mg_{0.15}Zn_{0.85}O$.

Next, to grow the active layer 5, the Mg cell and the dopant Ga cell are closed to then open the Cd source-metal cell shutter in order to apply Cd, thus growing a $Cd_{0.08}Zn_{0.92}O$ film to a thickness of 0.1 μm or so. Then, the Cd cell shutter is closed to then open the Mg cell and the Ga cell again, and plasma-excited $N_2$ as a p-type dopant is introduced. Although Ga is an n-type dopant, the p-type layer can be obtained effectively by doping simultaneously with plasma-excited $N_2$ to thereby. Thus, the p-type clad layer 6 made of $Mg_{0.15}Zn_{0.85}O$ is grown to a thickness of 0.2 μm or so, and as the same, by simultaneously doping the p-type contact layer 7 made of p-type ZnO is grown to a thickness of 1 μm or so to thereby form the semiconductor layer lamination 11.

Next, the wafer grown epitaxially in the MBE apparatus is taken out and put in, for example, a sputtering apparatus to form an ITO film, thus providing the transparent electrode 8 to a thickness of 0.2 μm or so. Then, the back surface of the substrate 1 is polished to provide its thickness of 100 μm or so, so that subsequently, for example, vacuum evaporation is carried out to form an n-side electrode 9 made of Ti/Al etc. thoroughly on the back surface of the substrate 1 and a p-side electrode 10 made of Ti/Al etc. on part of the ITO film 8 by, for example the lift-off method, to a thickness of 2 μm, respectively. Then, the wafer is scribed into chips, thus providing such an LED chip as shown in FIG. 1.

In the semiconductor light emitting device using a silicon substrate of the present invention, a silicon nitride film is formed on the surface of the silicon substrate, on which is in turn stacked a ZnO based compound semiconductor later, which can therefore be grown with good crystallinity, thus obtaining a blue region semiconductor light emitting device using a silicon substrate having almost the same high light emitting efficiency as that when it is grown on a sapphire substrate. That is, a ZnO based compound semiconductor conventionally grown on a silicon substrate has a poor film quality and also many non-light emitting recombination centers and so is deteriorated heavily in light emitting efficiency, in contrast to which, however, according to the present invention, a good-quality semiconductor light emitting device using a silicon substrate could be obtained.

The silicon nitride film, on the other hand, has a very small thickness of 10 nm or less, so that when sandwiched by the overlying and underlying conductive semiconductor layers, it has continuity with little voltage drop. This results in such a vertical-type light emitting device that from the right and back sides of the chip thereof, the p-side and n-side electrodes can be provided respectively, to thereby eliminate the necessity of etching part of a semiconductor layers laminated for electrode formation, thus significantly simplifying the manufacturing process and reducing the number of wire bonding steps by avoiding bonding either one of the two electrodes when the light emitting device because the other electrode can be directly connected by die bonding so that the device can be used very conveniently.

Further, when an LD later described is formed, an end face of an optical resonator is preferably a mirror face and in fact can be so by cleaving because cubic system semiconductor layers are laminated on a silicon substrate and so are aligned according to the cubic system starting from the surface of the substrate, so that the substrate is easy to cleave as compared to a sapphire substrate and the end face of the optical resonator can be formed of cleave face. As a result, a blue region semiconductor laser with excellent oscillation properties can be obtained.

The above-mentioned example with an LED holds true also with an LD. In the case of an LD, the semiconductor layer lamination 11 differs a little in that as shown in a cross-sectional explanatory view of FIG. 4, for example, preferably an active layer 15 is formed in a multi-quantum well structure in which a barrier layer and a well layer made of non-doped $Cd_{0.03}Zn_{0.97}O/Cd_{0.2}Zn_{0.8}O$ are alternately stacked as many, as two through five layers for each 5 nm and 4 nm respectively. Also, if the active layer 15 is too thin to sufficiently confine light therein, light guide layers 14 and 16 made of ZnO are provided on both sides of the active layer 15 respectively.

Figure 4:
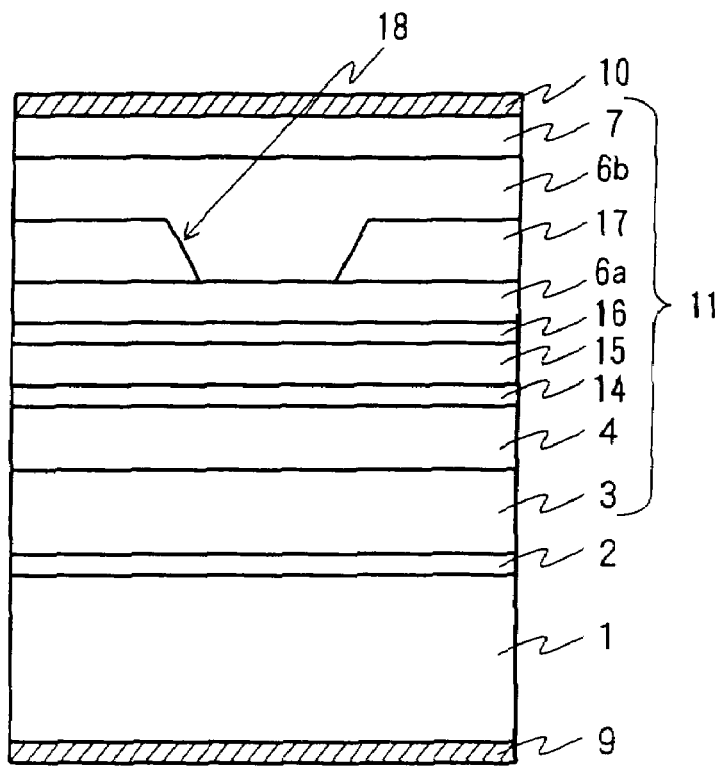
FIG. 4 is a cross-sectional view for showing another embodiment of the semiconductor light emitting device of the present invention.

Also, in the example shown in FIG. 4 of an LD chip with a SAS-type construction of burying a current blocking layer 17, on a p-type first clad layer 6a made of $Mg_{0.15}Zn_{0.85}O$ is formed the current blocking layer 17 made of, for example, an n-type $Mg_{0.2}Zn_{0.8}$ to a thickness of 0.4 µm or so, so that subsequently the wafer is once taken out of a crystal growing apparatus (MBE apparatus), on which is in turn formed a resist film and patterned into a stripe shape into which the current blocking layer 17 is etched using an alkaline solution such as NaOH to thereby form a stripe groove 18, after which the wafer is put in the MBE apparatus again to grow a p-type second clad layer 6b made of p-type $Mg_{0.15}Zn_{0.85}O$ and a p-type contact layer 7 made of p-type ZnO in much the same way as the previous example. In this case, the transparent electrode made of an ITO is rendered unnecessary and, instead, the p-side electrode 10 is formed almost throughout on the p-type contact layer 7 too. Note here that, although not shown, preferably an etching stop layer made of p-type GaN is provided between the p-type first clad layer 6a and the current blocking layer 17.

Figure 5:
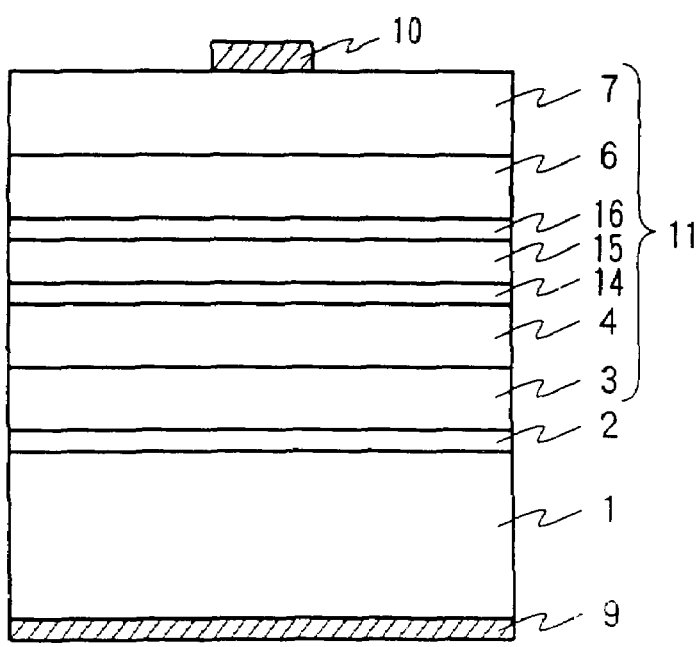
FIG. 5 is a cross-sectional view for showing a further embodiment of the semiconductor light emitting device of the present invention.

As compared to a GaN based compound semiconductor, a ZnO based compound semiconductor, which is capable of wet etching, can be used to form an LD chip of the SAS-type construction in which a current blocking layer is buried, to dispose the current blocking layer near the active layer, thus providing a semiconductor laser with excellent properties. Besides the SAS-type construction, however, the LD chip can have an electrode stripe construction in which the p-side electrode is formed only in a stripe, a mesa-stripe construction in which semiconductor layers on both sides of the stripe-shaped electrode are etched down to the top of the p-type clad layer, or a proton-implanted type construction in which protons, etc. are implanted. FIG. 5 shows an example of the LD chip of the electrode-stripe construction. This construction is the same as that of FIG. 4 except that the p-side electrode 10 is patterned into a stripe and that no current blocking layer is provided and so, the same elements are indicated by the same reference numerals and their explanation is omitted. Note here that a reference numeral 6 indicates a p-type clad layer.

Even in such a construction, the substrate 1 is made of silicon, so that the two electrodes can be provided on the right and back sides of the semiconductor layer lamination and the substrate respectively to thereby provide great convenience both in manufacture and use and also, the end face of the optical resonator can be formed as a cloven face by means of cleavage, thus providing a semiconductor laser with excellent properties.

Although the above example has been described of an LED with the double-hetero construction, the LED may have a simple pn-junction or MIS (Metal-Insulator Layer-Semiconductor Layer) construction, etc. Also, the LD chip is not limited to the above-mentioned stack construction but may, for example, be provided no light guide layer, or any other layers. Further, although the above example has employed an MBE apparatus to nitridate the silicon substrate and subsequently grow the ZnO based compound semiconductor layer, an MOCVD apparatus, for example, may be used instead in these nitridation and growing processes of the semiconductor layer as far as under appropriately set conditions without closely observing the surface condition to form almost the same quality of a surface.

According to the present invention using a silicon substrate, it is possible to grow a ZnO based compound semiconductor layer on the silicon substrate to thereby obtain a vertical-type blue region semiconductor light emitting device having the two electrodes provided on its right and back side surfaces. This feature simplifies the manufacturing process and reduces the costs and also decreases the wire bonding steps in the post-processing step, thus providing easy-to-use semiconductor light emitting device inexpensively.

Further, the device according to the present invention is capable of cleavage to thereby provide a laser resonator having an excellent end face. So a short-wavelength and high-performance semiconductor laser is obtained which can be utilized for an optical disc having a high recording density, and higher definition characteristics of a laser beam printer.

The following will describe a device using a ZnO based compound layer according to the present invention using such a sapphire substrate that has the main face which is a face perpendicular to the C-face and a method for growing a crystal of the ZnO based compound layer in order to manufacture this device.

Figure 6:
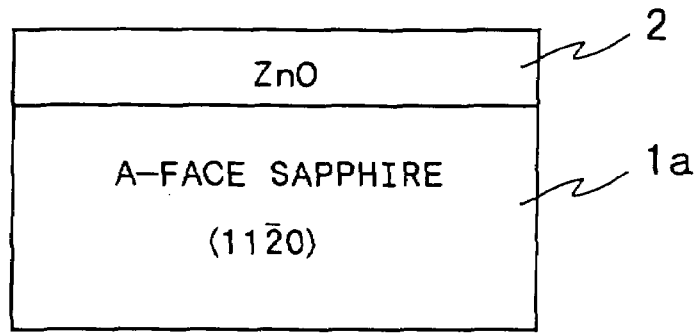
FIG. 6 is a cross-sectional view for showing a state of a ZnO layer grown on an A-face sapphire substrate of a still further embodiment.

As shown in FIG. 6 illustrating a cross-sectional view of its one embodiment, in a device having a ZnO based compound layer according to the present invention using a sapphire substrate includes a sapphire substrate 1a that has as its main face a face perpendicular to the C-face, and a ZnO based compound layer 2 which is grown epitaxially on the main face of the sapphire substrate 1a perpendicular to its C-face, for example, the A-face (11-20). This ZnO based compound is grown to a necessary thickness or in such a manner as to provide a necessary composition corresponding to an intended device, i.e. crystal mixture with Mg or Cd or doping of a dopant. To constitute a semiconductor light emitting device, for example, as described later, an n-type clad layer and a p-type clad layer formed of, for example, ZnO based compound semiconductor layers are sequentially stacked so as to sandwich an active layer by clad layers, the active layer has a smaller band gap than that of these clad layers, thus forming a light emitting layer forming portion.

Figure 7A:
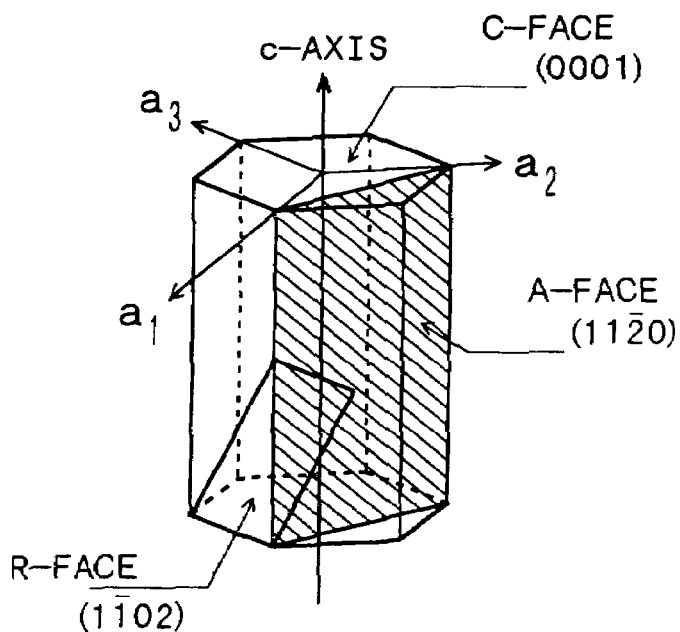
FIGS. 7(a) to 7(b) are illustrations for showing a typical face orientation of a sapphire single crystal.
Figure 7B:
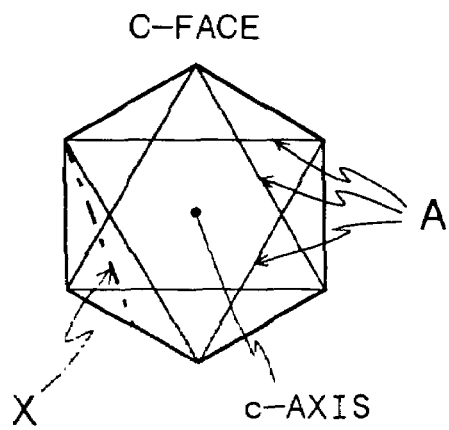

As can be seen from FIG. 7(a) illustrating a representative face orientation of a sapphire's single crystal and as can be seen from FIG. 7(b) illustrating a plan view of the single crystal's C-face, the A-face of sapphire is a face in which a line segment connecting every other lattice point of the C-face is perpendicular to the C-face, being indicated by a face orientation (11-20) of the sapphire's single crystal. This face orientation is of 6-time symmetry and, as shown in FIG. 7B, finds itself at six positions in a crystal consisting of one hexagonal column on the A-face, as described later, expectedly the c-axial length of sapphire corresponds to four a-axial lengths of ZnO to thereby provide an excellent crystal construction; on this concept, however, the A-face is not always necessary but, as indicated by X in FIG. 7B, even a face rotating in the C-face may be perpendicular to the C-face and so acceptable. Note here that "to be perpendicular to the C-face" is not strict but may be almost perpendicular to have a typical allowable error in face orientation of ±0.5 degree, which has almost no influence on fluctuations of the crystal axial length.

To grow a ZnO based compound layer on this sapphire substrate 1a, first sapphire wafer 1a having an A-face as its main face is washed for degreasing using acetone and ethanol and, finally, washed with pure water. Then, the washed wafer is put in a load lock chamber to be preheated at a vacuum degree of $133 \times 10^{-6}$ Pa or less and at 400° C. or so for one hour to thereby remove the remained water.

After the pre-heating, it is put in an MBE (Molecular Beam Epitaxy) apparatus held at a vacuum degree of $133 \times 10^{-9}$ through $133 \times 10^{-10}$ Pa. Then, it is thermally cleaned at 800° C. or so for 30 minutes or so and then heated to 650° C. or so. Then, an $O_2$ radical excited into plasma by an RF of 13.56 MHz is supplied and opened the shutter of the Zn cell, thus epitaxially growing a ZnO layer 2. Note here that to mix Mg and Cd in crystal or dope a dopant, the cell of these elements can be opened to obtain a desired ZnO based compound layer. Although the thermal cleaning was conducted at 800° C. or so for 30 minutes or so after washing in this example, annealing conducted at 1000° C. or so for one hour or so was approved to improve the reproducibility of the crystallinity of the ZnO layer grown thereby.

Thus, to check the crystal condition of the ZnO film epitaxially grown on the surface of the sapphire substrate having the A-face as its main face, an X-ray was applied to the surface of the ZnO film epitaxially grown to a thickness of a few hundreds of nano-meters or so to observe a normal position, as shown in FIGS. 8(*a*) and 8(*b*) together with the face orientation, of the face obtained from a resultant reflected-light intensity distribution. FIG. 8(*a*) shows the normal position of the face in the film grown on the sapphire substrate having the A-face as the main face of the present invention and FIG. 8(*b*), a normal position of the face in the ZnO film grown on the sapphire substrate having the C-face as the main face.

Since ZnO is of 6-time symmetry in the a-axial direction, it cannot exhibit more than six points of diffracted patterns (normal position of the face) originally; in the case of the ZnO film grown on the C-face shown in FIG. 8(*b*), however, besides a region where the ZnO's a-axis is parallel to the sapphire's a-axis, such a pattern is given as mixed that the ZnO's a-axis is rotated by 30 degrees with respect to the sapphire's a-axis and, as a result, 12 points of patterns were observed (actually, the pattern at the position rotated by 30 degrees had a low intensity and so observed to be small in proportion). In contrast, as shown in FIG. 8(*a*), the ZnO film grown on the A-face according to the present invention has the ZnO's A-face parallel to the sapphire's C-face, so that ZnO grown along the sapphire's c-axis in a constant crystal direction, so that only a 6-time symmetric diffracted pattern was observed. That is, no crystal growth a rotated by 30 degrees was observed.

Also, the MBE method was used to grow a crystal layer for one minutes or so (to a thickness of a few tens of nano-meters) and then it was checked by the RHEED method (High Reflection Energy Electron Diffraction Method, by which an electron beam accelerated at 10 to 50 kV by an electron gun is made incident upon on the substrate surface at a shallow angle (1-2 degrees or less), so that an electron beam reflected and diffracted by the surface atoms is projected onto a fluorescent screen to check the crystal surface condition), as a result of which a thin pattern was observed between the original ZnO patterns in the case of the film grown on the sapphire's C-face, while in the case of the ZnO film grown on the A-face according to the present invention, only the original ZnO pattern was observed without intra-face orientation disturbances.

Figure 9:
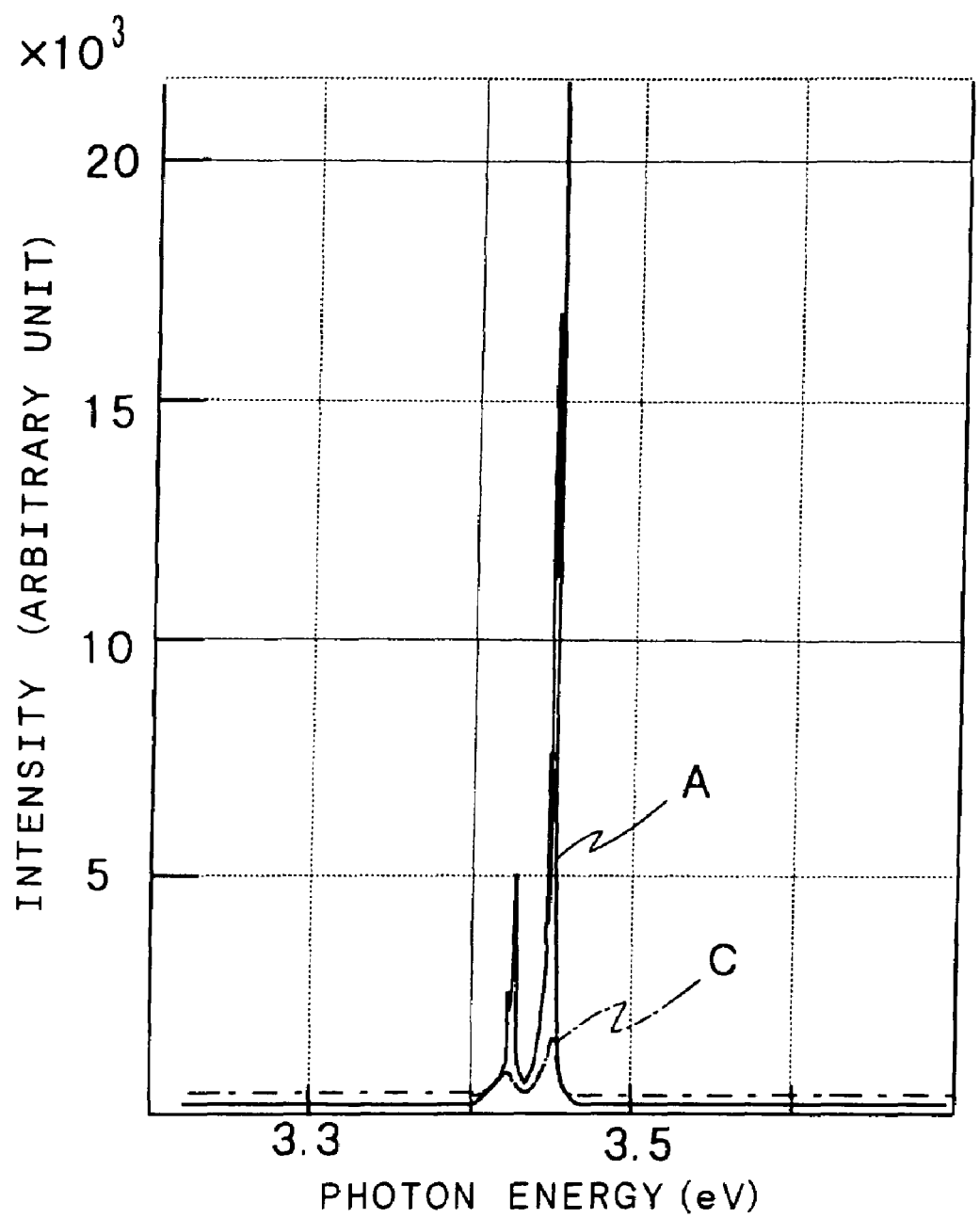
FIG. 9 is a graph for showing a contrast between a photoluminescent spectrum (A) of a ZnO layer grown on a sapphire substrate having an A-face as its main face of the present invention and that (C) grown on a sapphire substrate having a C-face as its main face.

FIG. 9 gives a result of checking the crystal layer condition of the ZnO film by a different method, specifically showing a graph of an emitted light intensity with respect to a wavelength in the case where light having a band gap energy of 4 eV larger than that of ZnO was applied to provide photoluminescence emission. A curve A in FIG. 9 indicates the characteristics of the ZnO film grown on the sapphire substrate having the A-face as the main face and a curve C, the characteristics of the ZnO film grown on the sapphire substrate having the C-face as the main face. As can be seen from FIG. 9, by the ZnO film of the present invention, an intensity about 30 times that of the ZnO film grown on the C-face could be obtained and also the resultant half-value width was a small value of 0.7 meV in the case of growth on the A-face of the present invention as compared to a value of 30 meV in the case of growth on the C-face, which clearly indicates an improved crystallinity.

Figure 10:
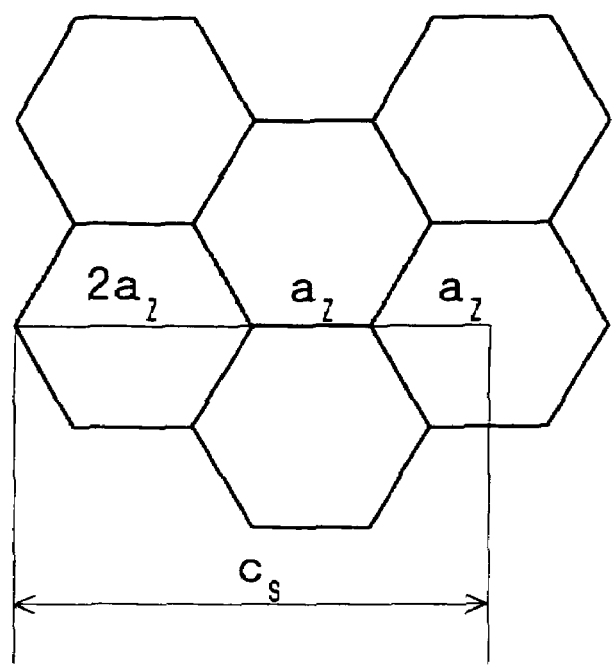
FIG. 10 is an illustration for showing an orientation of a ZnO crystal obtained when ZnO is grown on an A-face of sapphire of the invention.

According to the present invention, a ZnO based compound is grown on a sapphire substrate having as its main face the A-face perpendicular to the C-face, thus obtaining a ZnO based compound layer excellent in crystallinity as described above. The reason for this may be as follows. That is, since as mentioned above the sapphire's c-axial length $c_S$ is 1.2991 nm and the ZnO's a-axial length $a_Z$ is 0.325 nm, $c_S$ is roughly four times as long as $a_Z$. For this reason, as can be seen from a plan view of FIG. 10 showing the crystal condition of ZnO (C-face) grown on the sapphire substrate having the A-face as the main face, ZnO crystals corresponding to two crystals are aligned in the sapphire's c-axial length $c_S$ (crystals corresponding to four a-axis) to thereby greatly stabilize the intra-face orientation, thus always providing constant intra-orientation growth. In this case, the lattice mismatching rate ϵ is $\epsilon=(4\times a_Z-c_S)/C_S=0.07\%$, which indicates a very high matching degree. As a result, the crystal can grow at a high crystallinity.

From this viewpoint, it is guessed that besides the A-face, any face such as an X-face shown in FIG. 7(*b*) mentioned above that rotated in the C-face, that is, perpendicular to the C-face may be employed so that as shown in FIG. 10 mentioned above the ZnO based compound crystals are aligned such that four a-axial length of ZnO crystals correspond to one c-axial length of a sapphire crystal, thus obtaining a ZnO based compound crystal layer with similarly good crystallinity.

The following will describe an example of the configuration of a blue region semiconductor light emitting device in which a ZnO based compound semiconductor layer was grown on a sapphire substrate having this A-face (11-20) as the main face.

Figure 11:
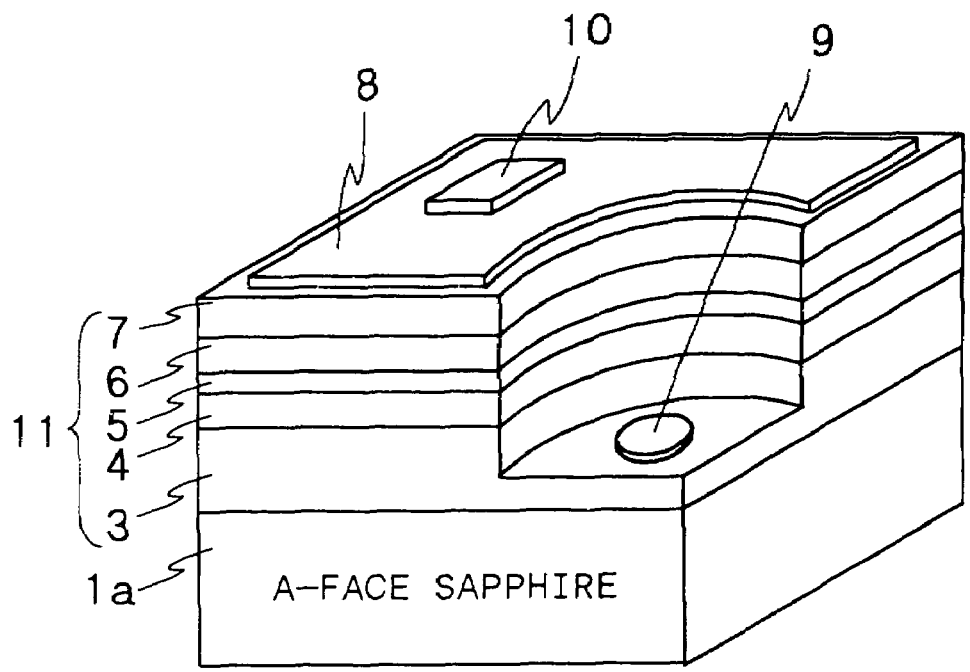
FIG. 11 is an illustration for an LED chip according to one example of the semiconductor light emitting device of the present invention using an A-face sapphire substrate.
Figure 14:
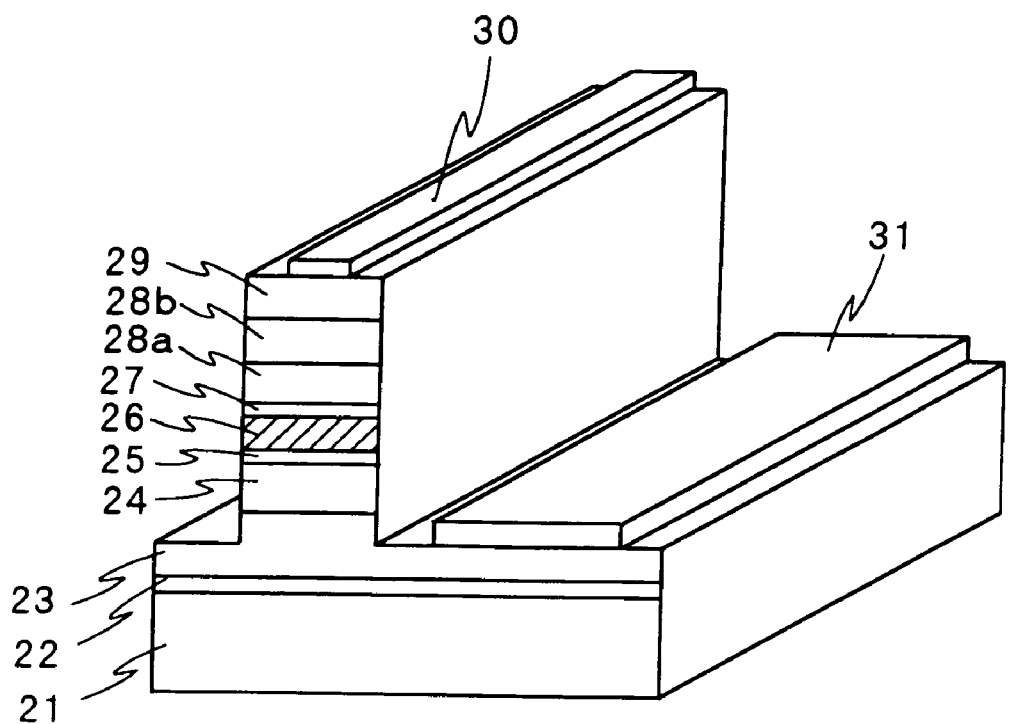
FIG. 14 is a perspective explanation view for showing one example of a prior art LD chip using a GaN based compound semiconductor.
Figure 15:
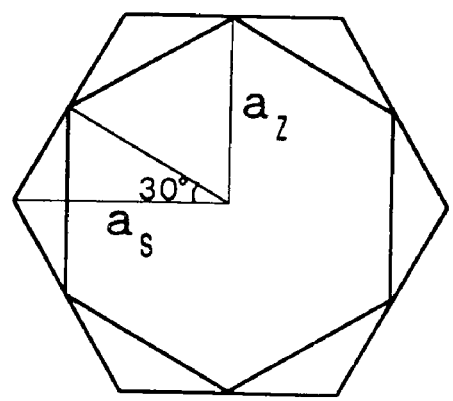
FIG. 15 is an illustration for showing a crystal orientation obtained when ZnO is grown so as to have its C-face oriented parallel of the C-face of sapphire.

As can be seen from its perspective explanatory view of an LED chip shown in FIG. 11, in the semiconductor light emitting device of the present invention using a sapphire substrate having as the main face a face perpendicular to the C-face, a sapphire substrate 1*a* having the A-face as the main face has thereon a semiconductor layer lamination 11 so as to form a light emitting layer, which has at least the n-type layers 3 and 4 and the p-type layers 6 and 7 made of a ZnO based compound semiconductor.

In the example shown in FIG. 11, the semiconductor layer lamination 11 has the contact layer 3 made of Ga-doped n-type ZnO with a thickness of 1 μm or so, the n-type clad layer 4 made of similarly Ga-doped $Mg_yZn_{1-y}O$ ($0 \leq y<1$, for example, y=0.15) with a thickness of 0.2 μm or so, the active layer 5 made of $Cd_xZn_{1-x}O$ ($0 \leq x<1$ with such a composition that has a smaller band gap energy level than that of the clad layer, for example, x=0.08) with a thickness of 0.1 μm or so, the p-type clad layer 6 made of $Mg_yZn_{1-y}O$ ($0 \leq y<1$, for example, y=0.15) to which Ga and N are doped simultaneously with a thickness of 0.2 μm or so, and the p-type contact layer 7 made of ZnO to which Ga and N are doped simultaneously with a thickness of 1 μm or so, in this order. And a double-hetero construction of light emitting layer forming portion is constituted by the active layer 5 and clad layers 4 and 6.

These semiconductor layers are consecutively grown by the above-mentioned MBE apparatus. Note here that preferably the active layer 5 is non-doped in order to avoid the formation of non-light emitting recombination centers. Also, the n-type and p-type clad layers 4 and 6 respectively are formed to have a larger band gap energy than that of the active layer 5 so as to provide an effect of confining a carrier in the active layer 5.

On the semiconductor layer lamination 11 is formed to diffuse a current the transparent electrode 8 made of, for example, an ITO film to a thickness of 0.2 μm or so, on part of which is formed the p-side electrode 10 made of a Ni/Al or Ni/Au layers by the lift-off method and part of which semiconductor layer lamination 11 is removed by etching to expose the n-type contact layer 3, on which is formed by vacuum evaporation, etc. the n-side electrode 9 made of a Ti/Al or Ti/Au layers.

Next, how to manufacture the LED is described. As mentioned above, the sapphire substrate 1 having the A-face as the main face is washed with acetone, etc. to degrease, preheated in the Load Lock chamber, and thermally cleaned in the MBE apparatus, after which an oxygen radical at 650° C. or so is supplied and the shutter of the cell of a desired material such as Zn, Mg, Cd and Ga is opened to epitaxially and sequentially grow the ZnO based compound semiconductor layers having their respective above-mentioned thickness values to thereby form the semiconductor layer lamination 11. Note here that to form the n-type layer, Ga was doped as a dopant, while to form the p-type layer, $N_2$ plasma and Ga were doped simultaneously as dopants.

Afterwards, the wafer having the epitaxially grown layers thereon is taken out of the MBE apparatus and undergone dry etching such as Reactive Ion etching (RIE) to etch off part of the semiconductor layer lamination to thereby expose the n-type contact layer 3. This etching may also be carried out by wet etching by use of a sulfuric acid-based etchant. Then, it is set in, for example, a sputtering apparatus to form an ITO film on the p-type contact layer 7, thus providing the transparent electrode 8 to a thickness of 0.2 μm or so. Then, the lift-off method is used to form the n-side electrode 9 made of Ti/Al etc. on the n-type contact layer 3 and the p-side electrode 10 made of Ti/Al, etc. on part of the ITO film 8 to 0.2 μm or so, respectively. Then, the wafer is scribed into chips, thus obtaining such an LED chip as shown in FIG. 11.

In the semiconductor light emitting device of the present invention using a sapphire substrate, on the surface of the sapphire substrate having the A-face as its main face is epitaxially grown ZnO based compound semiconductor layer, so that the c-axial length of each sapphire crystal and the four lengths of the a-axial length of ZnO based compound crystal are aligned with good matching, so that the ZnO based compound semiconductor layer can be grown with good crystallinity. Another ZnO based compound semiconductor layer grown thereon is also made of the same ZnO based compound, so that the layer grows with good matching with the former ZnO based compound semiconductor layer.

As a result, it is possible to avoid the occurrence of non-light emitting recombination centers unlike the case of a poor film quality to thereby greatly improve the internal quantum efficiency, which may be combined with the high exiton of the ZnO based compound, thus providing the semiconductor light emitting device with a very high light emitting efficiency. Note here that in place of ZnO, such a ZnO based compound semiconductor in which a part of Zn is partially substituted by Mg or Cd may be grown on the sapphire substrate having the A-face as the main face to provide almost the same lattice constant, thus having almost the same good crystallinity in growth.

Although the above example has been described with reference to an LED, the present invention can be applied also to an LD. In this case, the semiconductor layer lamination 11 is a little different in that, for example, as can be seen from the perspective explanatory view of FIG. 12, preferably the active layer 15 is formed to have such a multi-quantum well construction that a barrier layer and a well layer made of non-doped $Cd_{0.03}Zn_{0.97}O/Cd_{0.2}Zn_{0.8}O$ are alternately stacked as many as two through five to a thickness of 5 nm and 4 nm each time, respectively. Also, if the active layer 15 is too thin to sufficiently confine the light in therein, the light guide layers 14 and 16 made of, for example, ZnO are provided on the right and left sides of the active layer 15. Note here that like in the case of the above-mentioned LED, the n-side electrode 9 is formed on the n-type contact layer 3 exposed by etching part of the semiconductor layer lamination 11.

Also, in an example of an LD chip, as shown in FIG. 12, having a SAS-type construction in which the current blocking layer 17 is buried, on the p-type first clad layer 6a made of p-type $Mg_{0.15}Zn_{0.85}O$ is formed to a thickness of 0.4 μm or so the current blocking layer 17 made of n-type $Mg_{0.2}Zn_{0.8}O$, after which the wafer is once taken out of the crystal growing apparatus (MBE apparatus) and has a resist film formed thereon, which is then etched into a stripe shape to thereby etch the current blocking layer 17 into a stripe shape using a sulfuric acid-based solution, etc. to thereby form a stripe groove 18 having a width of 2 to 3 μm, after which the wafer is put into the MBE apparatus again, so as to then similarly grow the p-type second clad layer 6b made of p-type $Mg_{0.15}Zn_{0.85}O$ and the p-type contact layer 7 made of p-type ZnO. In this case, the ITO-made transparent electrode is unnecessary, so that the p-side electrode 10 is formed almost throughout on the p-type contact layer 7. Note here that although not shown, preferably an etching stop layer made of p-type GaN is provided between the p-type first clad layer 6a and the current blocking layer 17.

In contrast to a GaN-based compound semiconductor, a ZnO based compound semiconductor is capable of etching processing by means of wet etching, so that an LD chip having the SAS-type construction in which a current blocking layer is buried can be formed to thereby form the current blocking layer near the active layer, thus providing a semiconductor laser with high properties. Besides the SAS-type construction, the LD chip may be of an electrode stripe construction in which the p-side electrode is formed only in a stripe shape, a mesa-stripe construction in which the semiconductor layers on the right and left sides of the stripe-shaped electrode are etched into a mesa-type shape to the top of the p-type clad layer, or a proton-implanted type construction in which protons are implanted. An example of the LD chip of the electrode stripe construction is shown in FIG. 13. This construction is almost the same as that of FIG. 12 except that the p-side electrode 10 is patterned into a stripe shape and that no current blocking layer is provided and so their same elements are indicated by the same reference numerals and their explanation is omitted. Note here that a reference numeral 6 indicates the p-type clad layer.

Although the above example has employed a double-hetero construction of LED, any other constructions may be used such as a simple pn junction construction or an MIS (Metal-Insulator layer-Semiconductor layer) construction. The LD chip can also employs any construction having no light guide layer but any other one, besides the above-mentioned stacked construction.

Further, although the above examples have employed an MBE apparatus to grow a ZnO based compound layer, a MOCVD apparatus may be used instead. In this case, chemical phase reactions can be conducted using such reaction gases as di-methyl zinc ($Zn(C_2H_5)_2$) as Zn, tetra-hydro-furan ($C_4H_8O$) as O, cyclo-penta-diethyl magnesium ($Cp_2Mg$) as Mg, diethyl cadmium ($Cd(C_2H_6)_2$) as Cd, tri-ethyl gallium (TEG) as dopant Ga, and plasma $N_2$ as N.

Although the above examples have employed only a case of a semiconductor light emitting device using a ZnO based compound semiconductor, a device having the ZnO based compound semiconductor layers excellent in crystallinity can be obtained by similarly growing these layers on a sapphire substrate having as its main face such a face that is perpendicular to the C-face used in a SAW device, a piezoelectric device, or a pyro-electric device.

The present invention makes it possible to grow a ZnO based compound layer very excellent in crystallinity, on which in turn can be stacked another ZnO based compound layer excellent in crystallinity, thus obtaining the ZnO based compound layers with excellent properties.

Also, in a semiconductor light emitting device according to the present invention, very excellent crystallinity can be provided to the stacked ZnO based compound semiconductor layers, thus making it possible to obtain a blue region semiconductor light emitting device very excellent in inner quantum efficiency (light emitting efficiency) using such a material that can be wet processed.

INDUSTRIAL APPLICABILITY

The present invention makes it possible to grow a ZnO based compound semiconductor layer very excellent in crystallinity on a silicon substrate or sapphire substrate to thereby manufacture inexpensively a blue region light emitting device such as an LED or LD, a SAW device, a piezoelectric device, and a pyro-electric device having high properties. The blue region LED and LD having high properties can be obtained inexpensively and so can be used as a light source of a full-color display, a signal lamp, a next-generation high-recording-density DVD, and a laser beam printer.

What is claimed is:

1. A method for growing a ZnO based compound crystal layer, wherein a ZnO based compound layer is grown epitaxially on a sapphire substrate having an A-face as a main face, so that a c-axis of said ZnO based compound layer corresponds to a perpendicular direction to said main face, wherein said ZnO based compound crystal layer comprises an n-type clad layer, an active layer and a p-type clad layer, in which the active layer having a smaller band gap than that of said n-type and p-type clad layers is sandwiched by said n-type and p-type clad layers.

2. The method of claim 1, comprising steps of:
exciting oxygen radicals into plasma by a radio frequency signal; and
opening a shutter of a Zn cell.

3. The method of claim 1, comprising a step of growing an etching stop layer made of GaN between ZnO based compound crystal layers.

4. A method for growing a ZnO based compound crystal layer, comprising:
exciting oxygen radicals into plasma by a radio frequency signal; and
opening a shutter of a Zn cell,
wherein a ZnO based compound layer is grown epitaxially on a sapphire substrate having an A-face as a main face, so that a c-axis of said ZnO based compound layer corresponds to a perpendicular direction to said main face.

5. A method for growing a ZnO based compound crystal layer, comprising growing an etching stop layer made of GaN between ZnO based compound crystal layers, wherein a ZnO based compound layer is grown epitaxially on a sapphire substrate having an A-face as a main face, so that a c-axis of said ZnO based compound layer corresponds to a perpendicular direction to said main face.

* * * * *